United States Patent [19]
Hoyle, Jr. et al.

[11] Patent Number: 6,128,196
[45] Date of Patent: Oct. 3, 2000

[54] CIRCUIT BOARD CHASSIS

[75] Inventors: Willard O. Hoyle, Jr., Sterling; Robert Craig Abraham, Ashland; Keith A. St. Pierre, Stow; Vincent T. Curran, Walpole, all of Mass.

[73] Assignee: Stratus Computer, Inc., Marlboro, Mass.

[21] Appl. No.: 09/069,025

[22] Filed: Apr. 27, 1998

[51] Int. Cl.[7] ...................................................... H05R 5/00
[52] U.S. Cl. .......................... 361/752; 361/729; 361/730; 361/741; 361/753; 361/756; 361/754; 361/759; 361/796; 361/797; 361/800; 361/801; 361/802; 211/41.17; 211/87.01; 206/706; 206/454; 206/707
[58] Field of Search ................................... 361/785–789, 361/752, 756, 801, 727, 759, 741, 729–730, 796, 797; 211/41.17, 87.01; 206/706, 454, 707

[56] References Cited

U.S. PATENT DOCUMENTS

| | | | |
|---|---|---|---|
| 3,186,554 | 6/1965 | Mack et al. | 211/41.17 |
| 3,245,546 | 4/1966 | Stuhler | 211/41.17 |
| 3,320,483 | 5/1967 | Pohl | 361/801 |
| 4,648,009 | 3/1987 | Beun et al. | 361/759 |
| 4,947,289 | 8/1990 | Dynie | 361/801 |
| 5,293,303 | 3/1994 | Fletcher et al. | 361/798 |
| 5,432,682 | 7/1995 | Giehl et al. | 361/796 |
| 5,751,558 | 5/1998 | Gullicksrud et al. | 361/801 |

*Primary Examiner*—Jeffrey Gaffin
*Assistant Examiner*—Tuan Dinh
*Attorney, Agent, or Firm*—Cesari and McKennna, LLP

[57] ABSTRACT

A chassis system for housing a plurality of circuit boards, such as PCI standard bus boards, provides a rack-mountable chassis having an open front side and a motherboard with a plurality of board connectors arranged side-by-side with respect to the front end. The boards are mounted in individual frameworks that facilitate ready installation and removal from the chassis. In particular, the chassis includes a plurality of receiving blocks at the bottom rear of the chassis, aligned with each of the motherboard connectors. The receiving blocks receive pivots mounted on the back of each framework. The framework is inserted into, and removed from the front opening of the chassis in an upwardly pivoted position that clears the motherboard connectors and other obstructions in the chassis. The framework is pivoted into and out of engagement with the motherboard when the pivot is located in the receiving blocks. The chassis can include top-mounted tracks. The tracks receive rollers on the framework. When the framework is fully inserted into the chassis, the rear rollers lower the rear of the framework, having moved down a ramp. The front rollers can be selectively lowered and raised by actuating a movable bracket.

19 Claims, 9 Drawing Sheets

CIRCUIT BOARD CHASSIS

FIELD OF INVENTION

This invention relates to a circuit board chassis, and more particularly to housings for storing multiple circuit boards stacked together in a vertical rack.

BACKGROUND OF INVENTION

Housings or chassis having removable covers are commonly used for storing eight or more printed circuit boards in a parallel, front-to-back arrangement. Computer systems and network servers often require substantial numbers of individual circuit boards. Each of the boards in a particular housing is typically tied to a housing mother board using appropriate strip connectors each having a plurality of contact pads. The mother board of each housing is tied to the system or network using serial or parallel communication lines. The circuit boards can also include various input/output (I/O) connectors along the rear edge. When the boards are mounted in respective strip connectors on the mother board, the I/O edge connectors are accessible through ports in the rear housing side wall.

When the number of circuit boards required exceeds the volume of a standard housing, additional chassis or housings must be employed. Multiple chassis are typically arranged in a vertical stack in a rack. The rack and each chassis include prealigned mounting holes that enable each chassis to be bolted to the rack at an appropriate elevation. To save space, each chassis is usually mounted as close to the others as possible.

Figure 1:
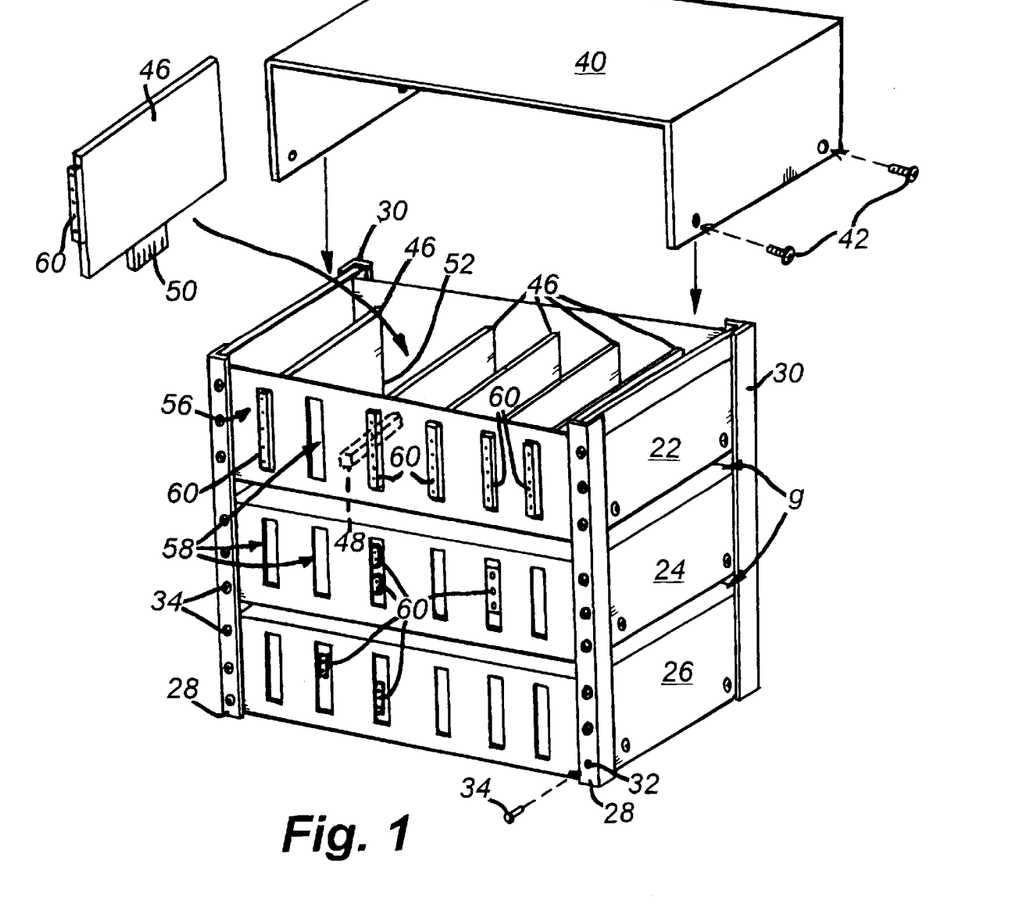
FIG. 1 is a somewhat schematic perspective view a set of rack-mounted chassis for housing a plurality of parallel circuit boards according to the prior art.

FIG. 1 details an exemplary rack 20 holding three vertical circuit board chassis 22, 24 and 26 according to the prior art. The rack 20 includes two front posts 28 and two rear posts 30 in this example. The rack can include only a pair of front posts 28 in an alternate arrangement. The front posts 28 can include a series of evenly spaced holes 32 along their lengths. The holes, and corresponding mounting holes or slots in each chassis (not shown) receive threaded fasteners 34 that secure the respective chassis to the rack 20. The lower chassis 24 and 26 are separated from each other and from the upper chassis 22 by respective gaps g. The gaps g are minimized, generally, to maximize vertical storage capacity of the rack system. As an example, the interior construction of the top chassis 22 is exposed. The top cover 40 is shown removed. Screws 42 are used to secure the cover 40 to the underlying housing. A variety of cover shape and securing arrangements are used. In all conventional arrangements, the top is removed to access circuit boards 46 stored inside. The circuit boards 46 are arranged in parallel, from front to back of the chassis. Each of the circuit boards 46 is attached to a respective female multiple-contact strip connector (connector 48 for example) via a corresponding male strip connector 50. The connectors are interengaged by applying downward pressure (arrow 52) to the board 46, and disengaged by applying opposing upward tension to the board 46. This connector arrangement requires that the interior of the chassis be accessed through the top. That is, sufficient room to slide the connectors together and pull the connectors apart exists when the top is opened.

Each chassis front panel 56 includes evenly spaced ports 58 through which various I/O connectors, status lamps and ports 60 are exposed. Besides acting as a series of port holes, the front panel 56 usually provides part of the chassis' structural integrity.

The gap g is usually too small to remove the top cover of lower chassis 24 or 26. Likewise, the overlying chassis obstruct installation and/or removal of circuit boards. Hence, to service the underlying chassis, the overlying chassis must be disassemble from the rack 20. This increases service time and labor, and may increase the chance of handling damage to components not being serviced due to droppage, accidental disconnection of components and the like.

Accordingly, it is therefore an object of this invention to provide a chassis for storing a plurality of circuit boards in parallel that enables rapid installation and removal of circuit boards from the chassis without necessitating removal or the top cover of the chassis, and without requiring substantial disassembly of rack-mounted components. The boards should remain securely mounted in the chassis once installed.

This invention overcomes the disadvantages of the prior art by providing a rack mountable chassis for multiple circuit boards that enables side loading of individual circuit boards, thus eliminating the need to remove a chassis top cover, and, in turn, to remove the chassis from its rack. Rather, aligned with respective connectors in the chassis motherboard upon entry, and, in one embodiment, a lifter mechanism allows the boards to be raised and lowered within the chassis by an external handle to selectively place them respectively out of and into contact with the chassis connectors.

According to a preferred embodiment, the chassis includes a motherboard located adjacent the bottom of the chassis. A strip connector is exposed along a bottom edge of the framework. The motherboard and circuit board strip connectors are arranged so that the downward pressure on the board away from the top, and toward the bottom of the chassis) causes a friction-fit connection between the boards. Likewise various I/O ports and/or connectors are exposed on a side edge of the framework. The chassis and the frameworks are each arranged so that the board can enter through an opening in the side of the chassis in an upwardly pivoted orientation. In other words, the framework can enter free of interference with the motherboard connector and other obstructions within the chassis. The chassis includes a plurality of receiving blocks at the bottom rear of the chassis, aligned with each of the motherboard connectors. The receiving blocks receive pivots mounted on the back of each framework. The framework is inserted into, and removed from the front opening of the chassis in an upwardly pivoted position that clears the motherboard connectors and other obstructions in the chassis. The framework is pivoted into and out of engagement with the motherboard when the pivot is located in the receiving blocks.

In another embodiment, the chassis can include top-mounted tracks. The tracks receive front and rear pairs of rollers on the framework. When the framework is fully inserted into the chassis, the rear rollers lower the rear of the framework, having moved down a ramp. The front rollers can be selectively lowered and raised by actuating a movable bracket. The bracket is moved using an actuatable lever that extends outwardly from the chassis opening.

In the preferred embodiment, the edge of the board-carrying portion having the I/O includes a removable edge piece with an I/O slot that exposes the I/O connectors. In combination, the edge pieces define the side wall of the chassis and provide further support to the chassis.

BRIEF DESCRIPTION OF THE DRAWINGS

The foregoing, and other objects and advantages of the invention will become more clear with reference to the following detailed description as illustrated by the drawings in which.

DETAILED DESCRIPTION

Figure 2:
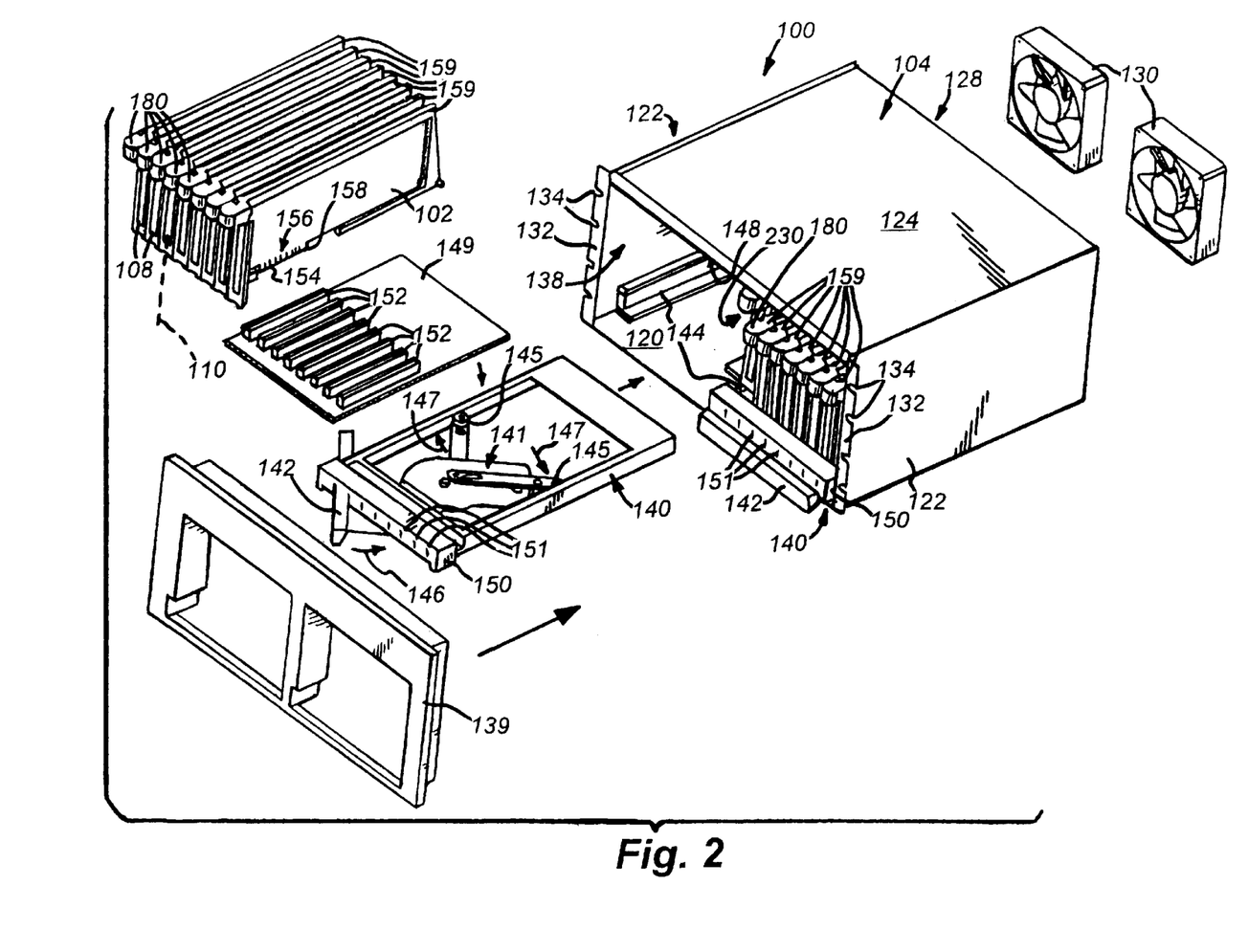
FIG. 2 is an exploded perspective view of a circuit board chassis system and corresponding circuit boards according to an embodiment of this invention.

FIG. 2 details a chassis system 100 for housing a plurality of circuit boards in a parallel, side-to-side arrangement according to this invention. It is contemplated that all circuit boards 102 have a maximum height (top-to-bottom) and maximum depth (front-to-back) that is less than the interior walls of the chassis, but boards can be substantially smaller in size than the housing by modifying the frameworks described further below to fit the particular circuit board to be housed in the chassis. In one embodiment the housing or chassis 104 has an interior height of approximately 10½ inches, a depth of approximately 18–19 inches and a width of approximately 17½ inches. These dimensions, in essence, define the maximum height and length (in the depth direction) of a circuit board, and the maximum number of boards (in the widthwise direction) located in the chassis 104. The circuit boards 102 can comprise individual bus-linked interface cards and associated controllers implementing the PCI standard according to one embodiment. However, circuit boards having any electronic function and any particular circuit configuration are expressly contemplated.

In general circuit boards have a standard height of 7½ inches. The depth of boards can vary up to the maximum as described further below. Circuit chips, connectors and other projections from the board are typically all oriented along one face of each board 102 (the face shown in all the figures herein). The opposing face (not shown) of each circuit board 102 contains a matrix of low-cut soldered lead wires exiting each of the circuit elements, and joined by printed circuit traces. The soldered circuit leads on the opposing face project no more than approximately 1/10 inch from the surface. Each circuit board typically includes on the exposed face, shown herein, one or more I/O ports, connectors or status indicators (e.g. LEDs) along the front edge 108 of the respective circuit board. These connectors project outwardly from the front edge 108, and are centered above the exposed face of the circuit board 102. The height of projection from the exposed face of the board is generally ½ inch. As such, the board tends to have a true width that is greater than the thickness of the board and that is centered approximately around the line 110. This width is one limiting factor in how closely boards can be placed adjacent each other. In the chassis 104 depicted according to the embodiment of FIG. 2, a total of sixteen circuit boards are mounted. It is contemplated that more boards or fewer boards can be mounted according to alternate embodiments, subject to the size limitations set forth above.

The chassis 104 includes a base or floor 120, a pair of opposing side walls 122 and an enclosed top 124. The chassis back wall 128 includes conventional openings for connectors, power cords (not shown) and fans 130. The front edges of the side walls 122 include outwardly extended flange plates 132 having slots 134 for receiving rack-mounting bolts as described above. The side walls and top are stamped from a single piece of sheet metal using conventional techniques according to this embodiment The side walls 122, top 124 and floor 120 together define a front opening 138 according to this invention. As will be described in detail below, the front opening 138 provides access to install and remove circuit boards according to this invention. A removable bezel 139 can be provided to the opening 138 to enhance the chassis' appearance.

The floor 120 of the chassis 104 supports a pair of side-by-side base frames 140 in this embodiment. The frames 140 are attached to the chassis 104 using quick release assemblies, that are actuated by the levers 142 shown in FIG. 2. The frames 140 are each received by a respective pair of side-by-side slots 144 located adjacent to the floor 120 of the chassis 104. The levers 142 are each rotated (curved arrow 146) when the frame 140 is located fully in the slots 144 to move (arrows 147) a pair of opposing locking lugs 145 into engagement with corresponding wells 148 in the slots 144. Thus, the frames can be locked and unlocked by rotating the respective lever 142. The frames 140 support a respective section of the motherboard 149 above the floor for cooling purposes and also to provide room for cabling and any connectors or leads projecting from the underside of the motherboard 149. The front of each frame 140 can include a raised panel 150 having a series of indicator lamps (e.g. PCI status LEDs) 151 each corresponding to a given circuit board/port. The motherboard 149 can include a variety of circuits and connectors. In particular, each motherboard section includes eight parallel multiple-contact strip connectors 152 of conventional design extending from front to back near the front edge of the motherboard 149. Each motherboard connector 152 is female in this embodiment, and is arranged to receive a corresponding multiple-contact male strip connector 154 formed as a series of conventional contact pads 156 on the raised edge 158 of the circuit board 102. The number of contact pads can vary. Typically, twenty or more pads are employed in a strip. Pads can be located on both sides of a circuit board.

Since the strip connectors generally enable insertion on the board only in a downward direction, the circuit board 102 should be located with its connector 154 directly over the motherboard connector 152 before downward pressure is applied to bring the connectors 152, 154 into engagement. The same is true for disengagement—the board should be withdrawn upwardly before rearward pulling tension is applied to withdraw the board from the chassis 104. In general it is desired that individual boards be removable from the chassis without requiring removal of the underlying framework. In particular, the front panel 150 covers the lower corner of each of the boards' front edges 108, requiring that the board pass over the panel 150 to be removed from the opening. On average, 1⅜ inches of vertical clearance is needed to move the circuit board connector 154 fully into and out of the motherboard connector 152. Accordingly, a special framework 159 surrounds each circuit board 102 to facilitate its upward and downward motion relative to the motherboard, and to ensure that the circuit board connector is properly aligned with the motherboard connector during the connection/disconnection process.

Figure 3:
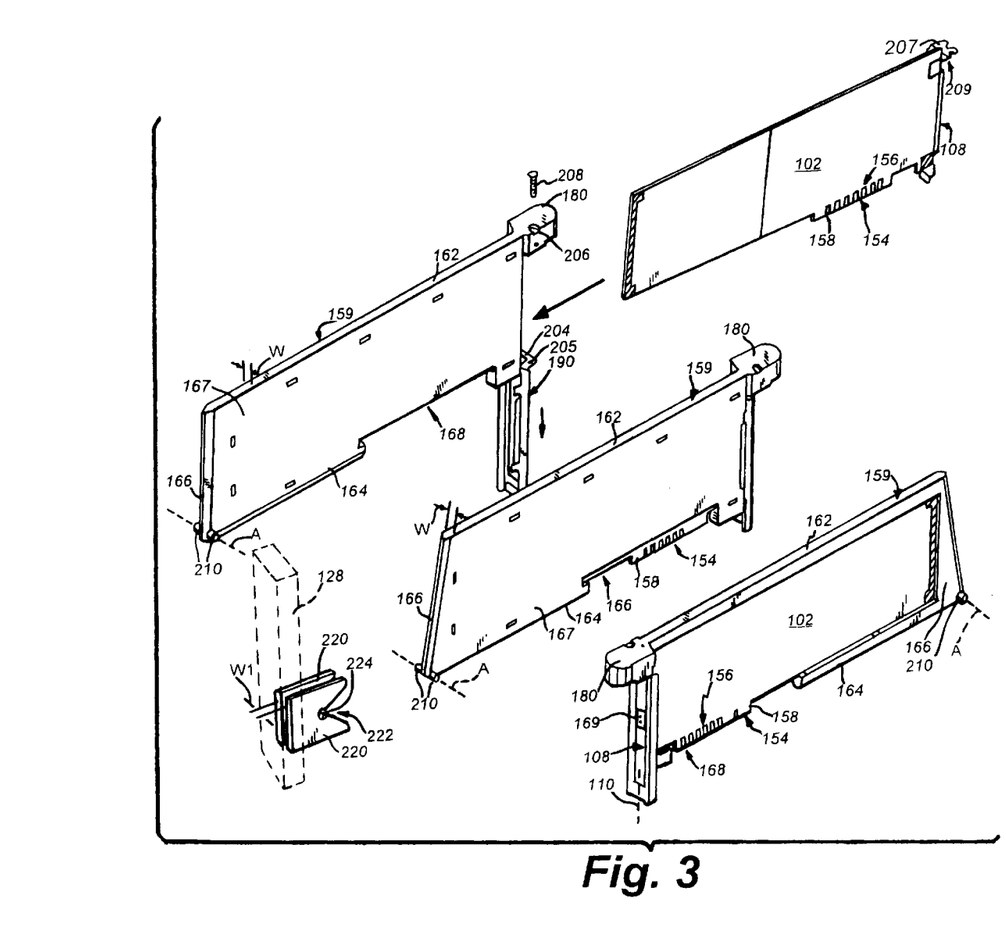
FIG. 3 is a partially exploded view of a plurality of circuit boards and corresponding circuit board frameworks for use in the system of FIG. 2 shown in various states of assembly.
Figure 4:
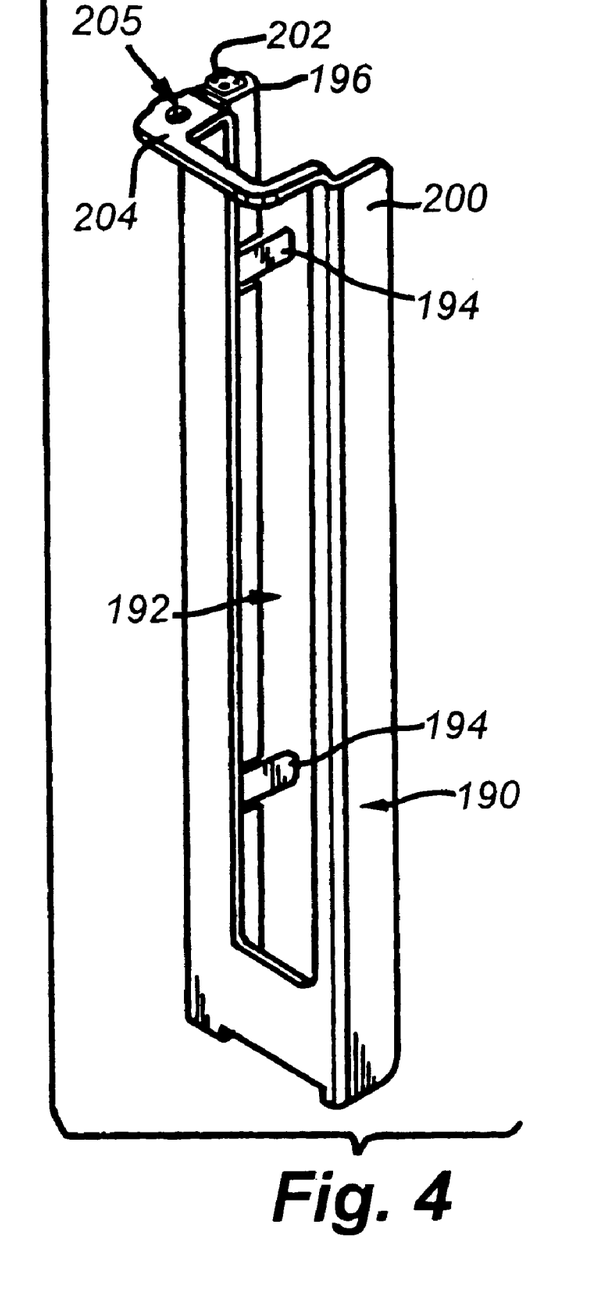
FIG. 4 is more-detailed perspective view of the removable side end piece for use with the frameworks of FIG. 3.

With further reference to FIGS. 3 and 4, the framework 159 is shown in greater detail. The framework 159 surrounds each of the top, rear and most of the bottom edge of the circuit board 102 with a corresponding upper edge 162, lower edge 164 and rear edge 166. The edges 162, 164 and 166 are formed as an integral unit in this embodiment from a durable plastic such as ABS. Alternatively separate pieces can be individually assembled into a framework, and other materials such as aluminum can be used in the construction of the framework. The edges 162, 164 and 166 can be joined by an integrally molded backing plate 167 along the rear face of the circuit board (the face that confronts the soldered leads). Alternatively, the board-carrying portion 160 of the framework 159 can remain open within its interior perimeter. The width W of the board-carrying portion 160 is between ½ and ⅝ inch in a preferred embodiment, but other widths are expressly contemplated. The upper and lower edges 162 and 164 are formed with channels having an internal width sufficient to seat the corresponding edges of the board 102, so that the board is captured by the framework, and restrained against widthwise movement. The front region 168 of the lower edge 164 is open to allow the connector 154 to pass therethrough. The front region should have sufficient clearance to allow the motherboard connector 152 (see FIG. 2) to pass thereinto without interference. As noted above, the exemplary I/O port 169 at the board's front edge 108 is approximately centered relative to the width W of the board-carrying portion 160 (along offset center line 110). In other words, the board-receiving channels in the edges 162 and 164 are formed so that the circuit board 102 is seated at an offset relative to the center line 110. In other words there is more widthwise space between the right side of the board 102 (as viewed) and the right side wall 170 of the board-carrying portion 160 than the widthwise space between the left side of the board 102 and the portion's left side wall 172. This enables the I/O, which stands "proud" of the board's surface, to be centered in the framework, and also provides clearance for circuit chips and other structures projecting from the board surface.

In this embodiment, the front end of the framework 159 can be selectively opened to allow the board to be inserted and removed by sliding the board along the upper and lower edge channels. The front of the upper edge 162 includes a projecting stop 180 that can be formed integrally with the upper edge. The stop 180 has sufficient clearance to enable the card to pass over it upon insertion and removal from the portion 160. Alternatively, the stop 180 can be removable.

Figure 5:
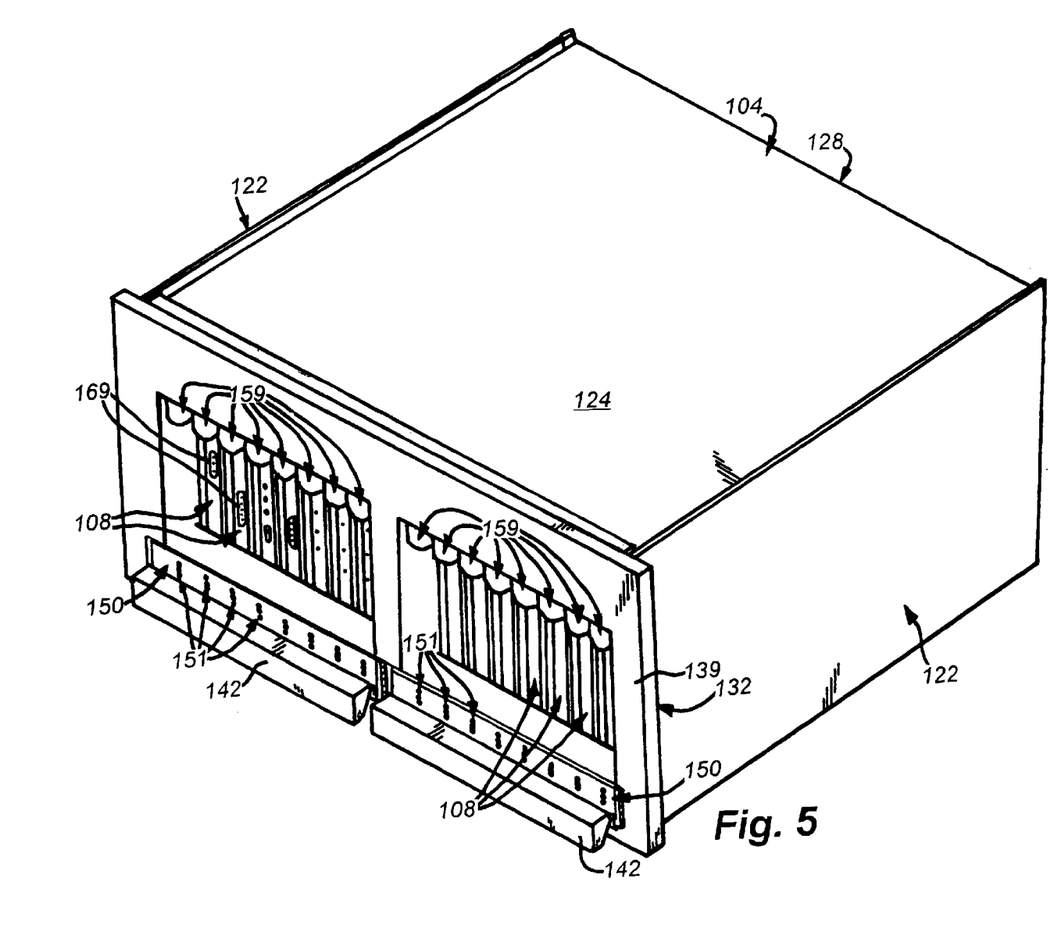
FIG. 5 is a perspective view chassis system of FIG. 2 in a fully assembled state.

The front edge of the board-carrying portion, in this embodiment, is secured by a removable insert 190 shown in greater detail in FIG. 4. The insert can be formed from plastic or from stamped sheet metal (Such as 1/16 inch aluminum). It includes a central hole 192 sized to allow desired I/O to be exposed therethrough. The hole 192 can be a standard size and shape to accommodate all popular I/O or can be customized to the particular I/O application. The insert 190 is attached to the front edge of the board 102 as shown generally in FIG. 3. That is, it can be slid up from beneath the stop 180 (arrows 197) until it is fully attached to the board by clips 194 that are spaced from the left wall 196 a sufficient distance to enable a pressure fit of the insert to the front edge of the board 102. In practice, it may be desirable to rotate the insert into final pressurable contact with the edge (curved arrow 198) once it is adjacent to the stop 180 to minimize frictional sliding of the clips directly over the surface of the board. The right side wall 200 and left side wall 196 together define the maximum width of the framework 159. The left side wall 196 is formed with an outer-facing pocket, that receives an elastomeric strip 202. the strip 202 is designed to pressurably, and sealingly engage an adjacent right side wall of another framework. When all frameworks are installed in the chassis of this invention, the inserts form a sturdy composite front wall with a series of evenly spaced I/O holes or slots (see generally FIG. 5). A top stop 204 is also provided to engage the bottom face of the framework stop 180. The top stop 204 includes a hole 205 for receiving a screw 208 that also passes through an alignment hole 206 in the framework stop 180 according to a preferred embodiment. This enables the insert 190 to be securely fastened to the framework, thus helping to retain the board within the framework as it is inserted and removed from the chassis. The front edge 108 of the circuit board 102 also includes a conforming alignment structure 207 having a recess 109 that is captured by the screw 208 in this embodiment. The screw 208 can be omitted, however, and a friction/snap-fit can be used to secure the board to the framework and the insert.

The framework 159 includes, at the lower corner of its rear edge 166, a pair of oppositely extended pivot axles ("pivots") 210 having an axis A substantially perpendicular to the plane of the board 102. Each pivot 210 is located so that it engages a corresponding of V-shaped receiving block 220. The receiving blocks 220 are mounted against the inner-facing side of the rear wall 128 of the chassis (shown partially in FIG. 3 for purposes of illustration). Alternatively, the receiving blocks 220 can be mounted on the motherboard at an appropriate height to engage the pivots 210. The individual pivot blocks, in particular, define respective V-shaped openings 222 that terminate in a rearwardly disposed pivot groove 224. The pivot blocks can be constructed from metal, plastic or another suitable material. The V-shape enables a framework 159 to be inserted into the chassis such that the rear end is guided by the V into a final rearwardly seated position with the pivot in the groove. In this position, the rear of the framework is located at the proper height above the motherboard and at the proper front-to-back location in the chassis to ensure alignment of the board connector 154 with the motherboard connector 152. The interior wall spacing W1 of the pair of receiving blocks 220 is chosen to be equal to or slightly greater than the width of the framework 159 at its rear edge. As such, the receiving blocks 220 also ensure that appropriate side-to-side alignment of the connectors 152, 154 is maintained. A pair of receiving blocks 220 is located in line with each "slot" in the chassis so that each framework can be aligned with an desired motherboard connector. As noted above, the sixteen slots of this embodiment use sixteen substantially equally spaced pairs of receiving blocks 220 are located on the rear wall 128 of the chassis 104.

The pivot assembly enables the rear end of the framework to rotate about the receiving blocks to generate the requisite 1⅜ inches or more of upward movement of the circuit board 102 away from the motherboard 149. The framework 230 in FIG. 2 is shown in an upwardly rotated position. In this position, the circuit board and motherboard connectors (not particularly detailed) are disengaged from each other, and the lower edge of the framework 230 can clear the raised panel 150 of the frame 140 when the card is withdrawn from the chassis 104 through the opening 138. Likewise, the framework 230 can be reinserted through the opening 138 to engage the receiving blocks in an upwardly pivoted position, and subsequently pivoted downwardly to bring the connectors into engagement—the engaged orientation shown in the adjacent frameworks 159. In general, the embodiment described above in general provides a quick and reliable system for insertion and removal of circuit boards from the chassis by using a straightforward move inwardly-rotate downwardly and rotate upwardly-pull outwardly set of motions.

Note that the front edges 108 of each framework 159 are maintained in a secure alignment by the inserts 190, in which the elastomeric strips 202 (FIG. 4) further enhance the side-to-side engagement of adjacent inserts by applying mild pressure therebetween. In combination, the fully installed inserts form a relatively sturdy front panel for the chassis. This is exemplified in FIG. 5, in which all sixteen frameworks 159 have been installed in the chassis 104. The removable bezel 139 encloses the front opening so that the I/O on each circuit board is still exposed, but, typically the cards are not readily removable unless the bezel is first withdrawn. The status indicators 151 in each raised motherboard framework panel 150 are also exposed through the bezel.

Figure 6:
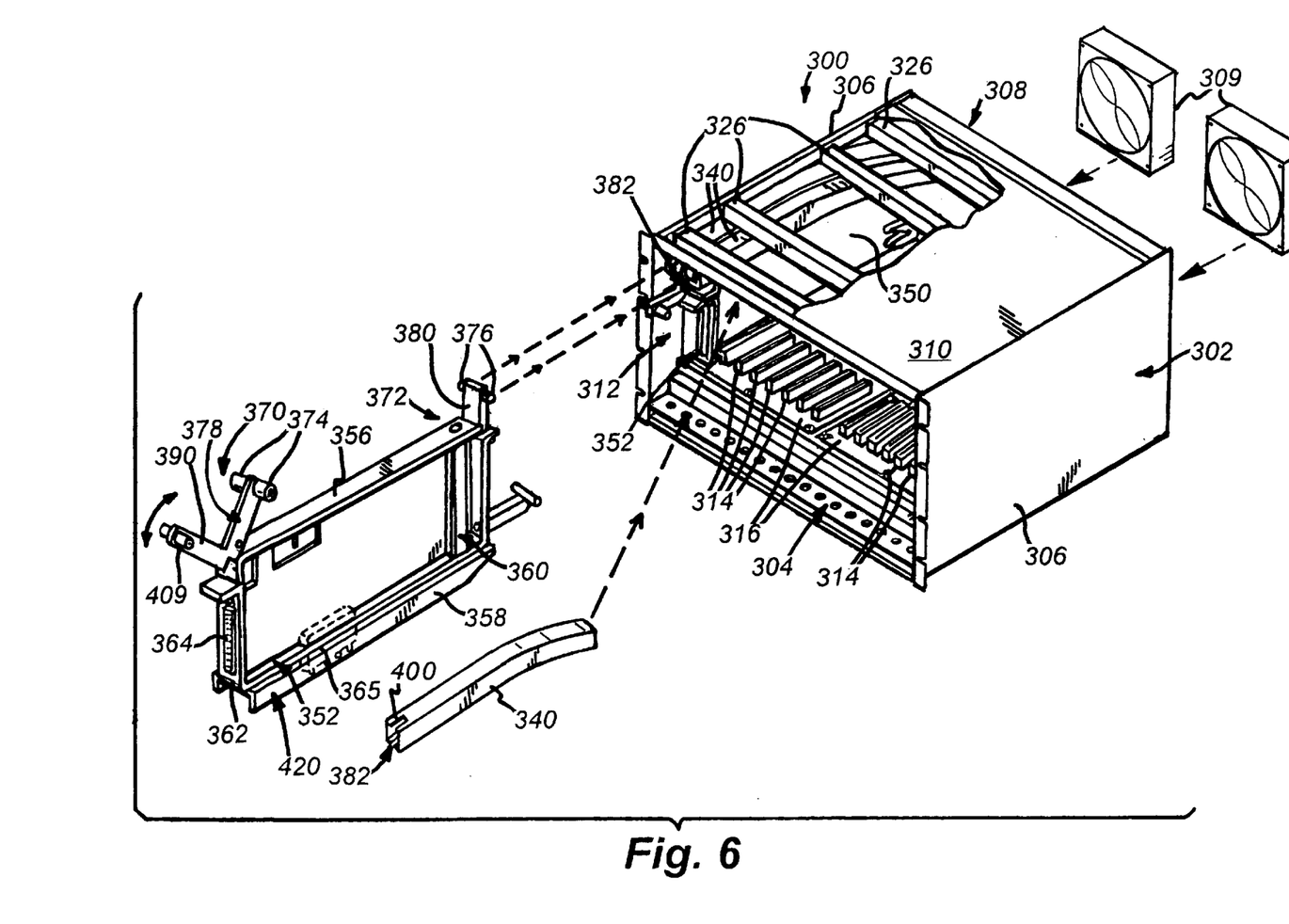
FIG. 6 is a partially exposed perspective view of a chassis system and corresponding circuit boards according to another embodiment of this invention.

FIG. 6 details an alternate embodiment of a chassis system 300 according to this invention. The chassis system 300 consists of a chassis 302, having a floor 304, side walls 306, a rear wall 308 with fans 309, and a top 310 that can be open—or enclosed as shown. The chassis 302 defines an front opening 312 for loading and unloading of respective circuit boards that are mounted in desired "slots" according to this embodiment. The slots are defined by respective connectors 314 of the motherboard 316 in the same manner as described above for the embodiment of FIG. 2. For the embodiments of both FIG. 2 and FIG. 6, the motherboard 316 can be mounted on an underlying framework of any acceptable design. The framework(s) can be permanently or removable attached to the chassis floor and can include any acceptable front structure (such as the raised status panel described above) Clearance should exist for the circuit boards to pass over the front structure for ease of insertion into and removal from the chassis interior.

According to the embodiment of FIG. 6, the chassis 302 includes a plurality of parallel cross members 326 extending across the width of the chassis interior between the side walls 306 and remote from the top 310. The cross members 326 are tied to the side walls 306 by rivets, welds or other forms of joints.

The interior of the housing further includes a row of track sections 340 attached to the interior-facing sides of the cross members 326 adjacent to the top of the chassis 302. The track sections 340, shown in part, are aligned from front-to-back with each slot of the chassis, as defined by a respective motherboard connector 314. Each track section is, in essence a downwardly curving (in a rearward direction) C-cross-section channel member. The open part of the "C" faces downwardly toward the chassis floor 304 along the full length of the channel member. Each track section 340 is attached to the cross members 326 by welds, rivets, screws or another suitable attachment technique. The downward slope of each track section is accommodated by a locating the rearmost cross members lower in the chassis than the forward cross members. Alternatively, the cross members can all be at the same height, and a spacer can be used between the top of each track section and each cross member's bottom side. Furthermore, cross members can be omitted according to an alternate embodiment, and the track sections can be attached (with appropriate spacers) to the inner-facing surface of the chassis top 310.

Figure 7:
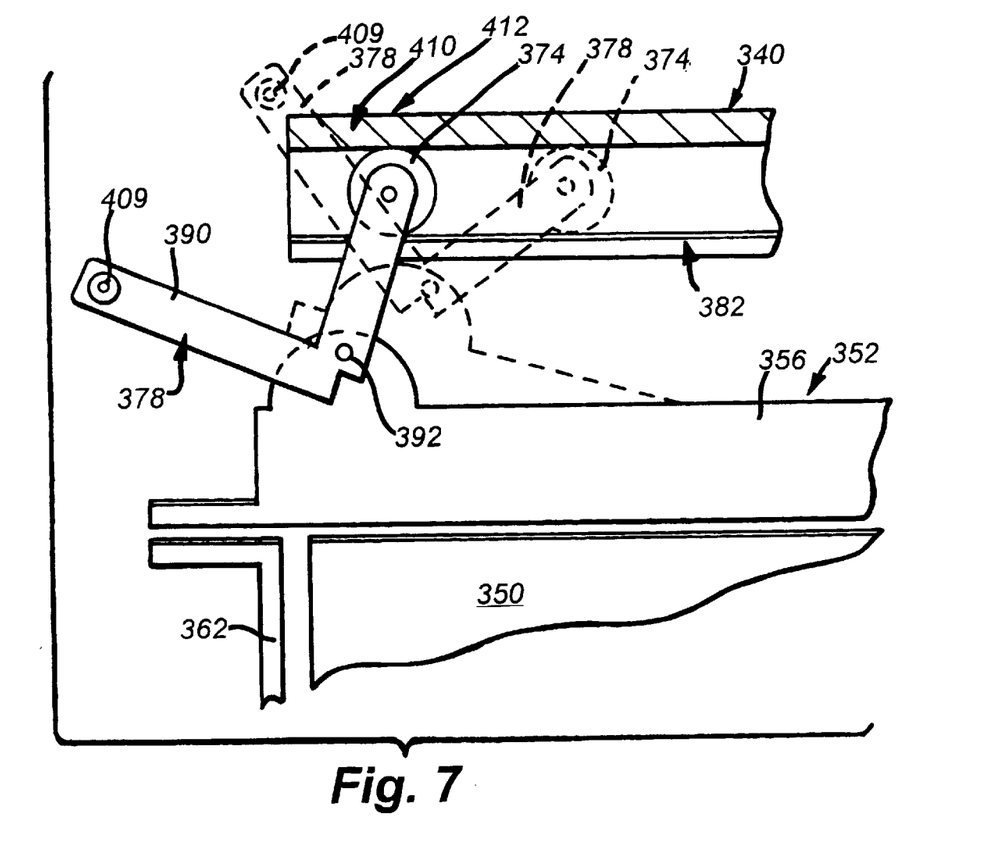
FIG. 7 is a partial side cross-section of an interengaging track and framework lifting lever mechanism for use in the chassis system of FIG. 6.

As in the embodiment of FIG. 7, circuit boards 350 are each mounted in respective frameworks 352 that expose the front edge 354 of the respective board to enable access to desired I/O. It is expressly contemplated that a variety of shapes and material choices can be employed in constructing frameworks according to any embodiment of this invention. The framework 352 according to this embodiment is constructed from a plurality of formed sections of aluminum or a similar metal. The framework 352 includes a top 356, bottom 358, rear 360 and front 362. In this embodiment, the front 362 is a rigid section that is joined into place using screws or a snap fit and that has a preformed hole for exposing board I/O 364. A circuit board 350, is installed in the framework 352 by disassembling the pieces of the framework (typically by removing screws) and sliding the board connector 365 through the connector groove 366 in the bottom 358 of the framework. The framework is then reassembled so that the groove in the rear 360 engages the rear edge of the board, and the front edge of the board is captured by the front's I/O hole. Note that an insert-style structure such as that shown in FIG. 4 can be used for the front of the framework in this embodiment. Elastomeric strips can be employed to form a pressurably engaged front wall composed of individual framework fronts.

The track sections 340 each define an open front that receives a front T-shaped roller assembly 370 and a rear T-shaped roller assembly 372 mounted to the top of the framework. The top of the "T" of each roller assembly 370, 372 consists of a pair of oppositely directed rollers 374 and 376 respectively, that extend perpendicularly to the track, along a widthwise-directed axis of rotation. The roller pairs 374 and 376 are mounted to flat base members 378 and 380 respectively, that each extend from the top of the framework 352. While rollers are used, any acceptable extension structure for engaging the channel of the track section is contemplated. Likewise, alternate, interengaging track and slide structures can be employed with the purpose of maintaining the framework in alignment with the slot as it is inserted into and removed from the chassis. For example, a bottom or side mounted track and slide arrangement can be employed.

Figure 8:
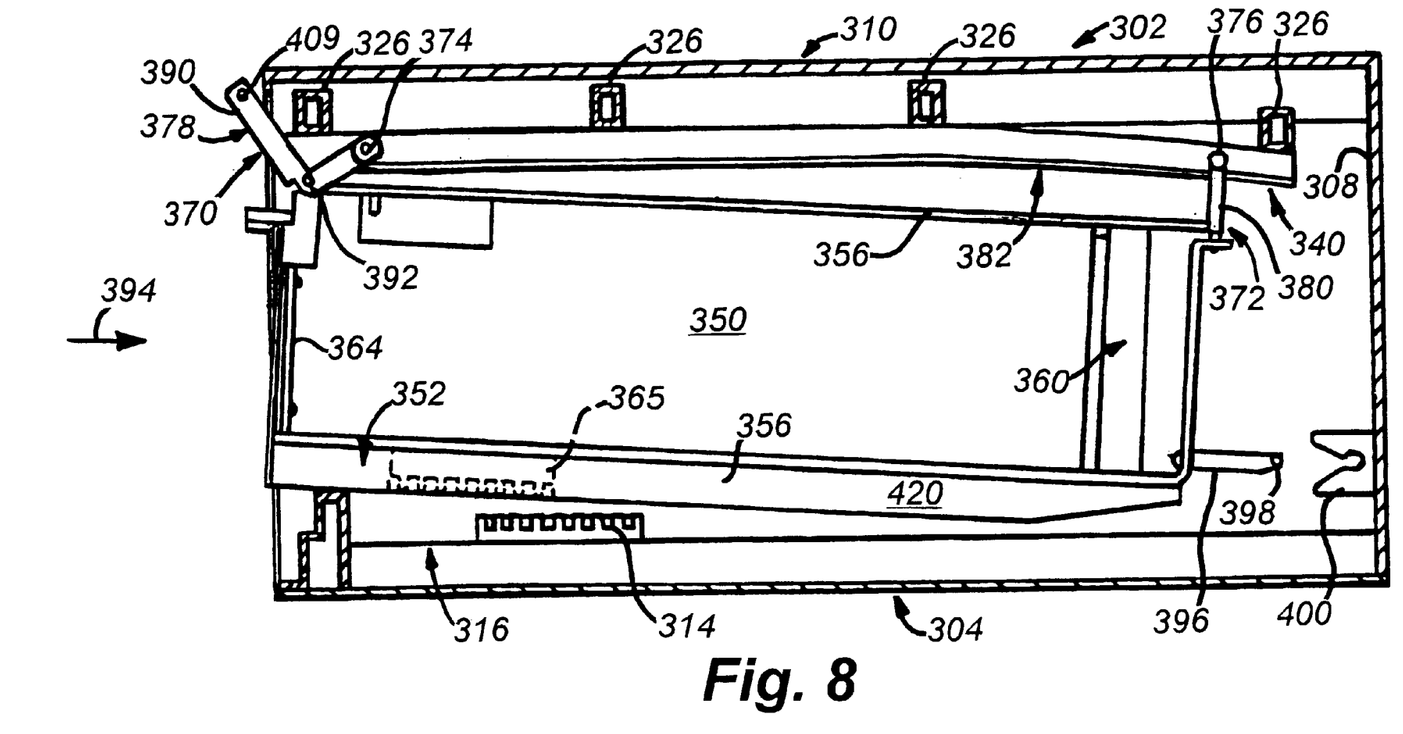
FIG. 8 is a side cross-section of the insertion of a circuit board framework assembly into a slot in the chassis of FIG. 6.
Figure 9:
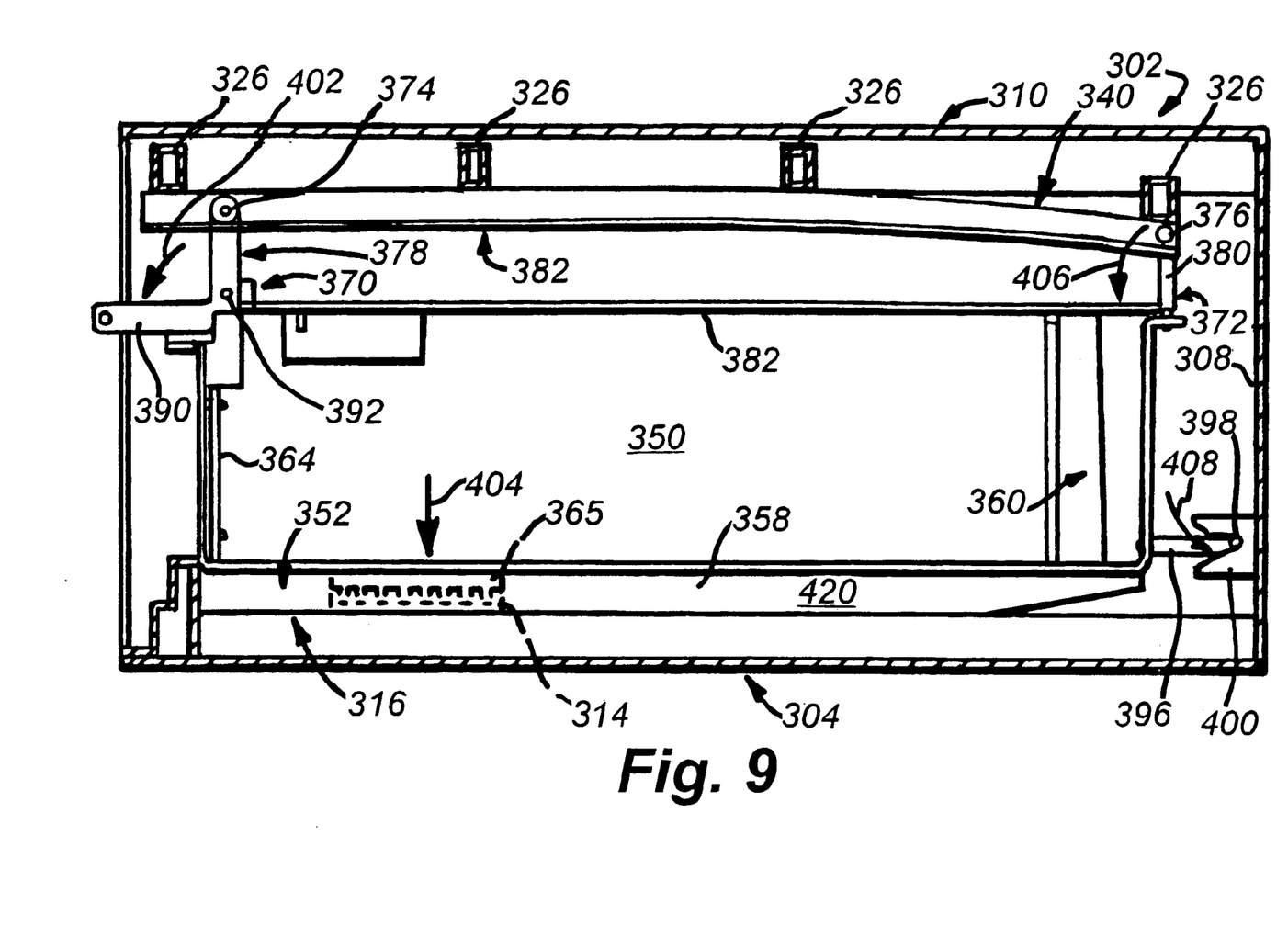
FIG. 9 is a side cross-section of the circuit board framework assembly of FIG. 8 located in a fully inserted position in the chassis.

The base members are sized to pass through the open front of each respective track section, and along the channel opening 382 at the bottom of the track section 340. The rollers allow the frameworks 352 to slide rearwardly into the interior of the chassis along the respective track sections 340 in a well-aligned orientation with minimal movement in the widthwise direction and elevational (upward-downward) direction. Again, the track sections 340 are applied to the cross members 326 or another upper frame member of the chassis so that each circuit board connector 154 is in widthwise alignment with a respective motherboard connector 152. In other words, each track defines a "slot" in the chassis adapted to receive a given circuit board. The height of the track section (which varies along its length for reasons still to be described) and the height of the rollers with respect to each framework are chosen so that the framework in an "uninstalled orientation" can be inserted into and withdrawn from the chassis with the bottommost surface of the framework passes over all obstructions on the floor of the chassis including the motherboard connector 314 of the respective slot. The term "uninstalled orientation" refers to the position of the front base member 378 of the front roller assembly 370. With further reference to FIGS. 7–9, the front base member 378 is an L-shaped lever having an handgrip 390 that extends outwardly from the front of the framework 352. The entire front base member 378 pivots about a pivot 392 so that movement of the handgrip 390 causes the framework 352 to move toward and away from the track section 340. This allows the user to select between an "installed position," in which the framework is moved away from the track as shown in solid lines in FIG. 7 and an "uninstalled orientation" (shown in phantom in FIG. 7), in which the framework is drawn toward the track section.

During installation of a circuit board and framework, as detailed further in FIG. 8, the handgrip is moved into an uninstalled orientation and the framework is moved (arrow 394) into the chassis interior with the front rollers 372 and rear rollers 374 engaging the track section 340. As the framework moves rearwardly, the rear rollers begin to descend along the track section 340, following its downward curve. The shape of the downward curve is chosen to enable the rear of the framework to fully clear any obstructions along the chassis floor 304, before it reaches a final, lowered elevation. This motion mimics the manual motion used to insert a framework into the receiving blocks according to the embodiment of FIG. 2 described above. The rear of the framework includes a pivot extension 396 that carries a perpendicularly extended pivot 398. The location of the pivot 398 is chosen to engage a receiving block 400 mounted on the chassis rear wall 308 when the framework has been fully inserted into the slot of the chassis, and the connectors on the circuit board and mother board are aligned.

As further detailed in FIG. 9, once the framework is in a rearwardmost position, with the pivot 398 in contact with the receiving block 400, the front base member is moved (curved arrow 402) to force the framework downwardly (arrow 404) bringing the connectors 314 and 365 into engagement. The framework pivots (curved arrow 406) about the rear rollers 376, driving (curved arrow 408) the lower pivot 498 fully into the receiving block wedge. The framework is thus moved into an installed position in the chassis. Removal of the framework is the reverse of installation, starting with lifting of the framework out of engagement with the motherboard using the handgrip 390 of the pivoting front base member 378.

The pivot extension 396 can be substituted for an rearwardly extended rear framework member similar to that of the FIG. 2 embodiment. Alternatively, the receiving blocks can be located closer to the rear end of the framework in an alternate embodiment.

The handgrip 390 of the front base member 378 includes a cross member 409 to aid in gripping. This cross member 409 also allows the handgrip 390 to be hooked onto the top 412 of the track section (see phantom lines in FIG. 7) to help secure the framework in an uninstalled position. A special groove 410 in the front of the top 412 can be provided to give clearance for the handgrip 390 to hook it onto the track section top 412. A variety of conventional stopping structures can be used to prevent the handgrip from being overextended in either direction.

The framework according to the illustrated embodiment also includes an optional skirt 420 surrounding the circuit board connector 365. The width of the skirt 420 is equal to or greater than the width of the motherboard connector, enabling the skirt to pass thereover as the framework is moved to the installed position. The skirt aids in aligning the lower end of the framework with the slot. Further alignment structures (not shown) can be applied to the floor or other portion of the chassis interior for engaging the skirt 420. The skirt extends downwardly no further than the downward extension of the circuit board connector 365 to prevent interference.

While a circuit board that is fully surrounded by the lower portion of the framework is detailed in each illustrated embodiment. It is expressly contemplated that a circuit board that is smaller than a standard size can be employed. Appropriate spacers can be applied to either the bottom or top edge, the front or rear edge, or both. The spacers enable the circuit board to be located so that its connector is aligned with the motherboard connector when the framework is in an installed position within a slot in the chassis. The framework, itself can be modified with shortened edges to seat a nonstandard-sized board where appropriate. When so modified, the rear edge should still include a stop to engage the chassis rear wall and hooks at the appropriate location. Other modifications to the tracks of the chassis can be undertaken to accommodate nonstandard sized circuit boards where appropriate.

Note that a related method and apparatus for enabling the front loading of a rack-mounted chassis is disclosed in applicants' copending patent application entitled Circuit Board Chassis and filed on even date herewith. The teachings of this application are expressly incorporated herein by reference. This application teaches the uses of a two-part framework for holding circuit boards that includes a series of tracks located along the top of the chassis along which the frameworks are slid into an installed position. When the frameworks reach an appropriate location within the interior of the chassis the framework is actuated to move the lower circuit board-carrying portion of the framework into engagement with the respective motherboard connector.

The foregoing has been a detailed description of a preferred embodiment of the invention. Various modifications and additions can be made without departing from the spirit and scope of the invention. For example, the arrangement of side walls, slopes and edge configuration of the upper and lower portions of the framework can be changed. The track arrangement can be modified or located at a position other than the interior top of the chassis. In addition, the manner in which a circuit board is attached to the framework can be varied. Accordingly, this description is meant to be taken only by way of example and not to otherwise limit the scope of the invention.

What is claimed is:

1. A system for housing a plurality of removable circuit boards each having a board connector removably interconnected with a respective motherboard connector of a motherboard installed in a chassis comprising:

a chassis having side walls, a top and a floor together defining an opening and a rear side opposing the opening;

a framework that engages the edge of a circuit board and that defines a bottom opening through which the circuit board connector projects and a rear pivot; and a pivot bracket that engages the rear pivot when the framework is fully inserted through the opening toward a location adjacent the rear side, the pivot and the pivot bracket being constructed and arranged so that, when the pivot engages the pivot bracket, the framework pivots between a disconnected position in which the circuit board connector is above and remote from the motherboard connector and a connected position in which the circuit board connector engages the motherboard connector, whereby the framework can be selectively inserted into and removed from the opening free of interference.

2. The system as set forth in claim 1 wherein the pivot bracket comprises a v-shaped receiving block assembly mounted adjacent to the rear of the chassis proximate the motherboard that receives the pivot thereinto.

3. The system as set forth in claim 1 wherein a front edge of the board-carrying portion is constructed and arranged to allow the circuit board to be selectively inserted thereinto and removed therefrom, and further comprising a removable front insert for covering a portion of the front edge.

4. The system as set forth in claim 3 wherein the front insert includes a pair of opposing parallel upstanding side walls substantially parallel to a plane of the circuit board, constructed and arranged to engage adjacent opposing parallel upstanding side walls of other front inserts located on adjacent frameworks in the chassis.

5. The system as set forth in claim 4 wherein one of the pair of opposing parallel upstanding side walls includes an elastomeric strip for pressurably engaging the adjacent opposing parallel upstanding side wall.

6. The system as set forth in claim 3 wherein the front insert includes an opening for exposing an I/O structure on the circuit board.

7. The system as set forth in claim 1 wherein the chassis includes a plurality of tracks for receiving rollers mounted on the framework, the rollers being located so that the framework passes through the opening free of interference, the rollers including a front roller pair having a movable bracket, the bracket being constructed and arranged to selectively move the framework toward the motherboard.

8. The system as set forth in claim 7 wherein the rollers include a rear roller pair about which the framework pivots in response to movement of the bracket, the track being ramped downwardly toward the motherboard adjacent the rear roller pair in a location in which the framework is substantially inserted into the chassis.

9. The system as set forth in claim 8 further comprising a receiving block assembly located adjacent to a rear of the chassis and proximate to the motherboard, the framework including a pivot that engages the receiving block when the framework is moved toward the motherboard.

10. The system as set forth in claim 8 wherein the bracket further includes an actuator lever that projects outwardly from the framework toward the opening when the framework is installed in the chassis, the lever being movable between each of two positions to, respectively, raise and lower the front of the framework.

11. The system as set forth in claim 1 wherein the chassis includes a pair of rack-mount support structures adjacent to the open front side that enable the chassis to be attached to a rack for supporting a plurality of chassis in a vertical stack.

12. A method for assembling a plurality of circuit boards having circuit board connectors into a chassis having a motherboard with a motherboard connector for interconnecting the circuit board connector, comprising the steps of:
providing a receiving structure adjacent to a rear side of the chassis with respect to a predetermined motherboard connector slot for receiving a circuit board;
providing a framework that engages an edge of the circuit board and that exposes the circuit board connector at a bottom edge thereof;
inserting the framework into the chassis through a front side opening, including engaging the receiving structure with a pivot located at a rear of the framework; and
rotating the framework downwardly about the pivot toward the motherboard connector and engaging the circuit board connector with the motherboard connector.

13. The method as set forth in claim 12 wherein the step of inserting includes sliding front pair of rollers and rear pair of rollers attached to the framework along a track mounted on the chassis with respect to the slot.

14. The method as set forth in claim 13 wherein the step of sliding includes moving a bracket on the front pair of rollers in a first direction the move the framework away from the motherboard and, after the pivot is adjacent to the receiving block, moving the bracket in a second, opposite direction to move the framework toward the motherboard.

15. The method as set forth in claim 12 further comprising installing a removable front insert on the framework having upstanding walls that defined a portion of a front wall and that includes an opening exposing I/O on the circuit board.

16. The method as set forth in claim 12 further comprising locating the chassis in a vertical rack having a plurality of chassis located therein.

17. A rack-mounted chassis having a top and a bottom and sides including a rear and an open front for accessing an interior of the chassis, the bottom including an interior-mounted motherboard with a plurality of parallel connectors arranged along a line parallel to the open front, each of the connectors defining a slot for mounting a respective circuit board connector of a respective circuit board thereinto, comprising:
a circuit board framework attached to each circuit board and including a portion that is selectively mountable to the chassis and that is constructed and arranged to enable attachment of the portion to a support on the interior chassis through the open front;
a pivot on the circuit board framework and a pivot bracket on the chassis that engages the rear pivot when the framework is fully inserted through the open front toward a location, the pivot and the pivot bracket being constructed and arranged so that, when the pivot engages the pivot bracket, the framework pivots between a position in which the circuit board connector is disengaged from the motherboard connector and a position in which the circuit board connector is engaged with the motherboard connector; and
a lifter mechanism that selectively moves the circuit board connector about the pivot into and out of engagement with the motherboard connector when the framework is supported by the support in the interior of the chassis.

18. The chassis as set forth in claim 17 wherein the chassis includes a track and wherein the lifter structure comprises a movable bracket that moves a roller toward and away from the framework to, thereby, move the framework with respect to the track in which the roller is positioned.

19. The chassis as set forth in claim 17 wherein the framework includes a removable insert on a front end thereof that defines part of a front wall for enclosing the open front, the insert having an I/O opening therein for exposing I/O of the circuit board and having upstanding walls that define sides of the insert and that are constructed and arranged to engage adjacent upstanding walls of an adjacent removable insert whereby a continuous wall is formed therebetween.

* * * * *